(12) United States Patent
Ichimaru et al.

(10) Patent No.: US 8,580,689 B2
(45) Date of Patent: Nov. 12, 2013

(54) PLASMA PROCESSING METHOD

(75) Inventors: Tomoyoshi Ichimaru, Kudamatsu (JP); Kenichi Kuwabara, Hikari (JP); Go Saito, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 72 days.

(21) Appl. No.: 13/210,446

(22) Filed: Aug. 16, 2011

(65) Prior Publication Data

US 2013/0015158 A1    Jan. 17, 2013

(30) Foreign Application Priority Data

Jul. 13, 2011  (JP) ................................. 2011-154408

(51) Int. Cl.
  *H01L 21/302* (2006.01)
(52) U.S. Cl.
  USPC ........... 438/689; 438/620; 438/715; 438/723; 438/728; 216/67; 216/70
(58) Field of Classification Search
  USPC ........... 438/689, 715, 620, 723, 728; 216/67, 216/70; 156/662, 643, 646
  See application file for complete search history.

(56) References Cited

U.S. PATENT DOCUMENTS

| 6,624,065 | B2 * | 9/2003 | Jang et al. ............ 438/633 |
| 6,713,380 | B2 * | 3/2004 | Kokubu ............ 438/620 |
| 6,784,110 | B2 * | 8/2004 | Wen et al. ............ 438/706 |
| 6,875,680 | B1 * | 4/2005 | Park ............ 438/595 |
| 2002/0045332 | A1 | 4/2002 | Jang et al. |
| 2004/0266136 | A1 | 12/2004 | Jung et al. |
| 2012/0315749 | A1 * | 12/2012 | Hempel et al. ............ 438/591 |

FOREIGN PATENT DOCUMENTS

| JP | 2000-077658 | 3/2000 |
| JP | 2005-19892 | 1/2005 |
| JP | 2005-026662 | 1/2005 |
| KR | 2002-0029531 | 4/2002 |

OTHER PUBLICATIONS

Korean Official Action dated Sep. 14, 2012, for KR Application No. 10-2011-0078895.
Communication mailed Mar. 28, 2013, in connection with Korean Patent Application No. 10-2011-0078895, 3 pages; Korean Patent Office, Republic of Korea.

* cited by examiner

*Primary Examiner* — Nadine G Norton
*Assistant Examiner* — Maki Angadi
(74) *Attorney, Agent, or Firm* — Antonelli, Terry, Stout & Kraus, LLP.

(57) ABSTRACT

The present invention provides a dry etching method capable of readily providing rounded top edge portions, called top rounds, at trenches and vias formed by removal of a dummy material. The method of the present invention is a dry etching method for forming trenches or vias by removing a dummy material with its periphery surrounded by an interlayer oxide film, which method includes the steps of etching the dummy material to a predetermined depth, performing isotropic etching after the dummy material etching, and removing remaining part of the dummy material after the isotropic etching.

8 Claims, 3 Drawing Sheets

(a) INITIAL STRUCTURE (b) BREAK-THROUGH PROCESS (c) MAIN ETCHING PROCESS (d) FILLING PROCESS

PLASMA PROCESSING METHOD

BACKGROUND OF THE INVENTION

The present invention relates to dry etching methods using plasma.

In recent years, to cope with the quest for higher performance of semiconductor devices, a combined technology of high-dielectric-constant (high-k) gate insulating film and a dual metal gate has been developed and put into practical use to resolve a decrease in drive current and an increase in leakage current. As manufacturing methodology according to the technology there are two approaches: a gate-first technique, which is a conventional gate electrode fabrication method, and a gate-last technique.

The gate-last technique is a method having the steps of forming dummy gates made of material such as polycrystalline silicon, filling an interlayer oxide film between the dummy gates after forming a source and a drain, and removing the dummy gates. A metallic material is filled in a trench portion which was formed by removal of the dummy gate; then, the filled metal material is polished by chemical mechanical polishing (CMP) to thereby form a metal gate (see JP-A-2005-19892).

In the gate-last technique just described, a process of removing the dummy gate by dry etching to thereby form a trench is essential. In addition, there is an occasional need that upper edge portions of this trench are rounded when the trench is formed. In other words, it is required from time to time to provide rounded top edge portions (top rounds) to the trench which is formed by removal of the dummy gate.

A method for forming a trench with its upper corners rounded in a surface of semiconductor substrate is disclosed in JP-A-2005-26662.

SUMMARY OF THE INVENTION

However, the above-stated technique of the related art is a method for forming a trench using a mask and formation of a trench without using any mask is not taken into consideration. Moreover, the method for forming a trench by removal of a dummy gate is a method for forming a trench using no masks.

Hence, the above-stated technique of the related art is not directly usable in order to provide top rounds for a trench or a via which is formed by removal of the dummy gate. Also, it should be noted that this issue is common to dry etching methods for providing top rounds for trenches or vias which are formed by removal of dummy material.

It is therefore an object of the present invention to provide a dry etching method capable of readily providing top rounds for a trench or a via which is formed by removal of dummy material.

In accordance with one aspect of this invention, there is provided a dry etching method for forming a trench or a via by removing a dummy material with its periphery surrounded by an interlayer oxide film, wherein the method includes the steps of etching the dummy material to a predetermined depth, performing isotropic etching after the etching of the dummy material, and removing remaining part of the dummy material after the isotropic etching.

In accordance with another aspect of the invention, a metal gate manufacturing method using the gate-last technique of forming a metal gate by filling a metal film in a trench formed by removing a dummy gate and polishing the metal film is provided, wherein the method includes a round adjustment step of etching the dummy gate to a predetermined depth, a round forming step of forming a round by isotropic etching after the round adjustment step, a main etching step of removing remaining part of the dummy gate after the round forming step, an filling step of filling a metal film after the main etching step, and a polishing step of polishing the metal film filled.

With the arrangements of this invention, it is possible to readily provide top rounds for trenches and/or vias which are formed by removal of dummy material.

Other objects, features, and advantages of the invention will become apparent from the following description of the embodiments of the invention taken in conjunction with the accompanying drawings.

DESCRIPTION OF THE EMBODIMENTS

The present invention provides a dry etching method for forming a trench or a via by removing a dummy material with its periphery surrounded by an interlayer oxide film, wherein the method includes the steps of etching the dummy material to a predetermined depth, performing isotropic etching after the etching of the dummy material, and removing remaining part of the dummy material after the isotropic etching.

One embodiment of the present invention is explained with reference to the accompanying drawings below.

Embodiment

In the present embodiment, an example is described in which the present invention is applied to a method for forming a metal gate using a gate insulating film made of a high-k material with the gate-last technique.

First, a plasma etching apparatus used in the present embodiment is explained.

Figure 1:
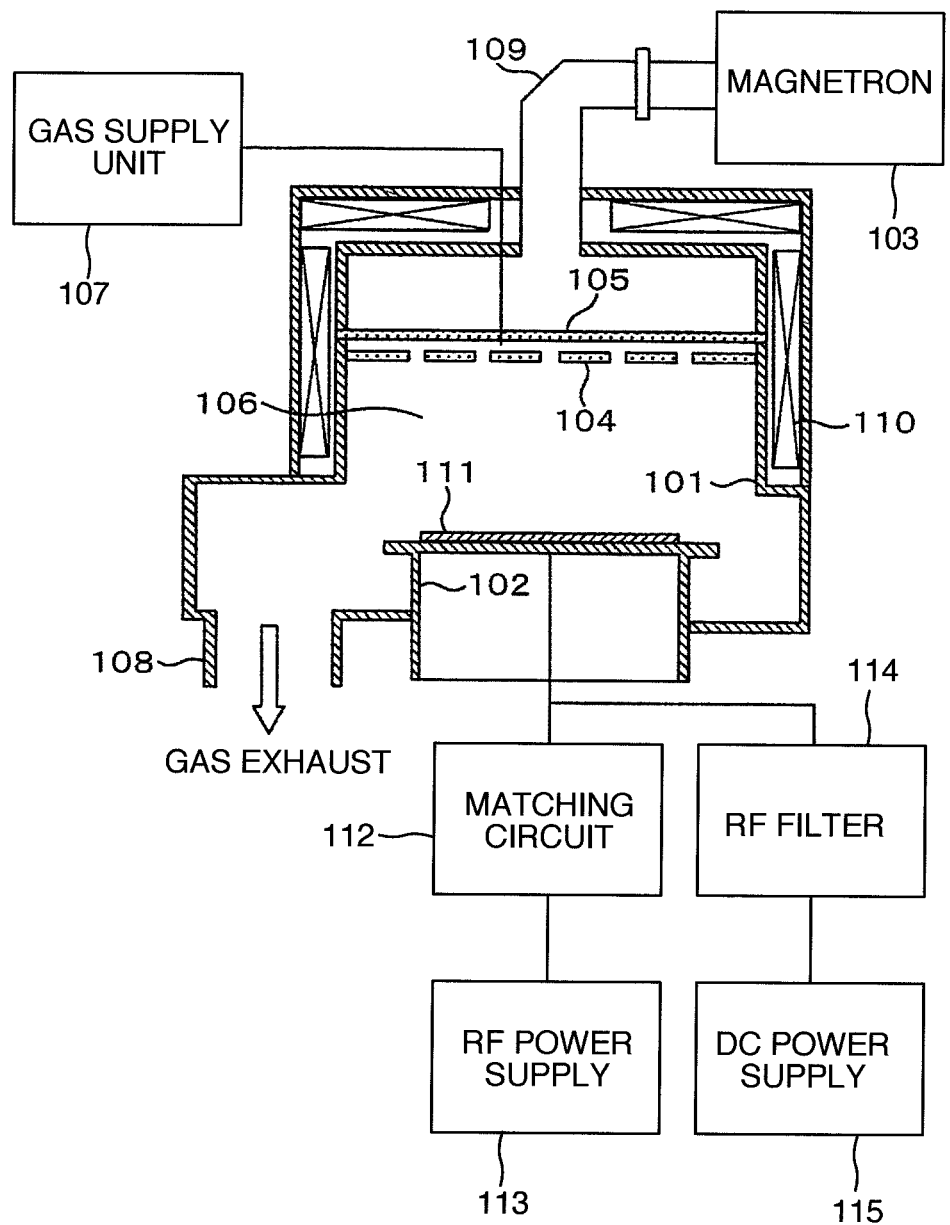
FIG. 1 is a schematic diagram of a longitudinal cross-sectional view of a plasma etching apparatus used in one embodiment of the present invention.

FIG. 1 is a schematic diagram of a longitudinal cross-sectional view of the plasma etching apparatus used in the present embodiment.

At upper part of a vacuum chamber 101 with its top end open, a shower plate 104 made of quartz is installed to introduce an etching gas into inside of the vacuum chamber 101 and by sealing air-tightly with a dielectric window 105 made of quartz a processing chamber 106 is formed. Connected to the shower plate 104 is a gas supply unit 107 which causes the etching gas to flow. Also, the inside of the vacuum chamber 101 is decompressed and evacuated by a vacuum exhaust unit (illustration is omitted) which is connected thereto through a vacuum exhaust port 108.

To transfer electrical power to create plasma to the processing chamber 106, a waveguide 109 which transmits electromagnetic wave is provided above the dielectric window 105. A microwave which is sent to the waveguide 109 is generated by a magnetron 103. The frequency of the microwave generated from the magnetron 103 is 2.45 gigahertz (GHz). Around the outer periphery of the processing chamber 106, a magnetic-field generating coil 110 for generating a magnetic field is provided; the microwave generated by the magnetron 103 creates high-density plasma in the processing chamber 106 by interaction with the magnetic field generated by the magnetic-field generating coil 110. Further, toward the bottom of the vacuum chamber 101, a sample stage 102 is provided opposing to the shower plate 104, on which a wafer 111 is mounted. The sample stage 102 has its sample stage surface covered with a thermal-sprayed film (illustration is omitted) and is connected with a direct current (DC) power supply 115 through a radio-frequency (RF) filter 114. Furthermore, a radio-frequency (RF) power supply 113 is connected to the sample stage 102 via a matching circuit 112.

A wafer 111 which is transferred into the processing chamber 106 by a transfer unit (illustration is omitted) and mounted on the sample stage 102 adheres to the surface of the sample stage 102 by electrostatic force of a DC voltage which is applied from the DC power supply 115. Then, an etching gas is fed into the processing chamber 106 from the gas supply unit 107 via the shower plate 104 to set the inside of the vacuum chamber 101 at a predetermined pressure. High-density plasma is produced within the processing chamber 106 due to interaction of the microwave which was transmitted into the processing chamber 106 through the waveguide 109 and the dielectric window 105 and the magnetic field that is generated by the magnetic-field generating coil 110. Additionally, by applying RF electric power from the RF power supply 113 to the sample stage 102 ions are attracted from the plasma toward the wafer 111 mounted on the sample stage 102 so that anisotropic etching of a film to be etched which the wafer 111 has is enabled by an ion-assist etching scheme.

Next, an explanation is given of the wafer 111 used in the present embodiment. As shown in part (a) of FIG. 2, the wafer 111 has a structure in which a dummy gate 202 as a tentative gate electrode on a silicon substrate 201, a native oxide film 205 on the dummy gate 202, a thin insulating film 204 on each sidewall of the dummy gate 202, and an interlayer oxide film 203 on the further outside of the thin insulating film 204 are arranged respectively.

The wafer 111 having such a structure is processed using the above-stated plasma etching so that a metal gate using the gate insulating film of high-k material is formed by the gate-last technique in a procedure described below.

Figure 2:
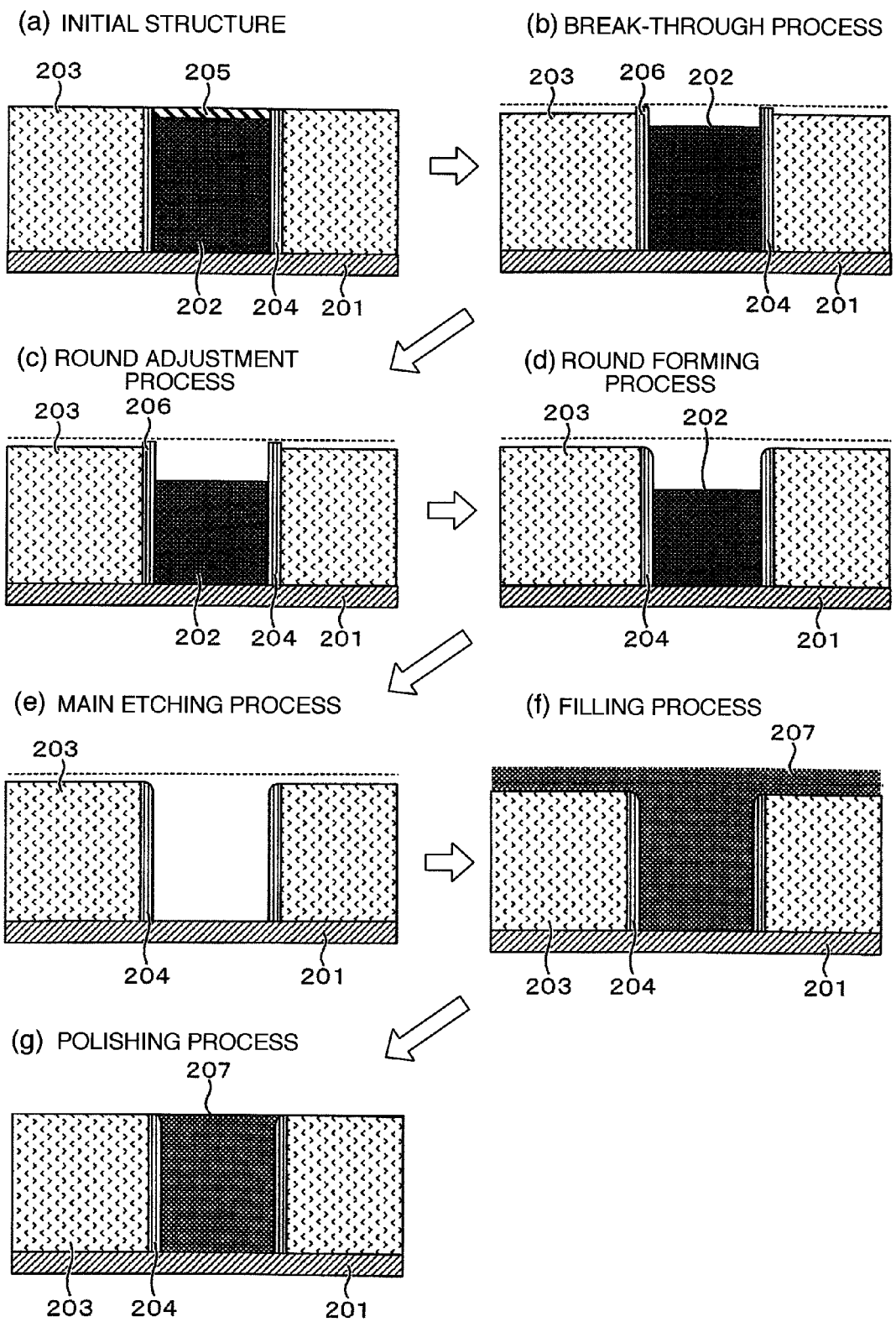
FIG. 2 is a diagram to explain a flow of a metal gate forming method which incorporates the principles of the present invention.

First, as shown in part (b) of FIG. 2, a break-through process is carried out, which is for removing the native oxide film 205 using $Cl_2$ gas and using plasma with the process pressure set to 0.2 Pa and the microwave electric power set to 800 W while applying RF power of 80 W.

In this break-through process, the insulating film 204 has a lower etch rate because it has a stronger corrosion resistance than the interlayer oxide film 203 of better coverage and thus the insulating film 204 is hard to be etched; thus, a profile of a projected end 206 is formed, which is a shape of the top end part of the insulating film 204 protruding above a top surface of the interlayer oxide film 203. Next, as shown in part (c) of FIG. 2, a round adjustment process is performed, in which the dummy gate 202 is removed to a predetermined depth using a mixture gas of $Cl_2$ gas, $O_2$ gas, HBr gas, and Ar gas and plasma with the process pressure of 0.4 Pa and the microwave power of 800 W while applying RF power of 80 W. The predetermined depth is a depth which permits exposure of a sidewall of the insulating film 204 in contact with the dummy gate 202 by a degree corresponding to a desired rounding amount of the upper part of the insulating film 204.

With this process, by adjusting the predetermined depth the size of the round profile in a direction of the depth can be adjusted for a semiconductor device to be fabricated.

Also, in order to maintain the height of a finally formed metal gate to the initial dummy gate height, etching conditions of this round adjustment process are required to be specific conditions for making higher etching selectivity between the dummy gate 202 and the interlayer oxide film 203 so that a least amount of the interlayer oxide film 203 is etched when the dummy gate 202 is completely removed.

Next, as shown in part (d) of FIG. 2, a round forming process is performed, which is for forming a round at a corner of the trench or the via without a protrusion at the top end part of the insulating film 204 using a mixture gas of $O_2$ gas and $CHF_3$ gas and plasma with the process pressure of 0.3 Pa and the microwave power of 700 W while applying no RF power.

This round forming step is a process of etching the profile of the protruded end 206 into a rounded profile by isotropic etch technique. In this round forming process, it is possible to form rounded wall edges for the reason which follows.

Since portions of high etchant collision probability are selectively etched away by means of isotropic etch technique, the protruded end profile 206 is selectively etched and removed. Therefore, the upper part of the insulating film 204 is processed to have a rounded profile without a protrusion.

Besides, it is possible to adjust the rounding amount of the top end part of the insulating film 204 by adjusting an etching time in this round forming process so that the size of the rounded profile can be controlled in this round forming step with the etching time adjustment.

In general, incident ion energies increase with an increase in the RF power so that the performed etching tends to become anisotropic. Also, due to an increase in energies of incident ions acting on the etching, the etching rate is increased. Therefore, in the round forming process it is preferable that the RF power is low; more preferably, this power is 0 W. This is because upon incidence of high-energy ions, the etching of the exposed portions of the interlayer oxide film 203 is accelerated when ions with high energies enter and an amount of removal of the interlayer oxide film 203 increases. Also, since the etching rate increases with the increase in RF power, etching time adjustment for control of the rounded profile becomes difficult.

Therefore, by performing the isotropic etching with application of low RF power, it is possible to suppress the amount of removal of the interlayer oxide film 203 to effectively form the rounded edge profile within a desired etching time period. To do this, it is necessary at the above-stated round forming process that the RF power is set within a range of from 0 W/cm$^2$ to 0.042 W/cm$^2$ and the incident ion energy is set within a range of 0 eV to 170 eV.

Although in the above-stated round forming process $CHF_3$ gas is used as the main etching gas, another gas containing fluorine such as $CF_4$ gas, $SF_6$ gas, $NF_3$ gas, $CH_2F_2$ gas, $CH_3F$ gas, or $C_4F_8$ gas can be used to form rounded wall edges at the upper part of the insulating film 204.

The adjustment of the round profile at the upper part of the insulating film 204 can also be controlled by adjustment of the mixture ratio of $O_2$ gas and fluorine-containing gas, other than by adjustment the RF power in the round forming process stated supra. The reason of this follows.

When the main etching gas is $CHF_3$ gas, for example, it is dissociated by plasma, resulting in production of radicals and ions of carbon, hydrogen, and fluorine. While reaction products of high vapor pressures are exhausted from the vacuum chamber 101 through the vacuum exhaust port 108, reaction products of low vapor pressures attach to the surface of a film being etched. These attachments serve as a protective film against the etching, thereby lowering the etching rate. In cases where a film of the attachments is extremely thick, the etching may not even progress. Usually, such reaction products attach thickly to the surface of the to-be-etched film at those portions where fewer ions irradiate.

When $CHF_3$ gas is used as the etching gas, most attaching reaction products are made of compounds containing carbon; by adding $O_2$ gas, therefore, highly volatile $C_xO_y$, which is a reaction product of carbon in the attachment and oxygen of the $O_2$ gas, is generated and the attachment can be reduced. Thus, it is possible by an added amount of $O_2$ gas to adjust the etching rate of the upper part of the insulating film 204, thus enabling control of the size of the rounded profile.

In the round forming process of the present embodiment, an optimal round profile was obtained by adding approximately 15% of $O_2$ gas with respect to the flow rate of $CHF_3$ gas. This added amount of $O_2$ gas is needed to be optimized depending on the species of a fluorine-containing gas to be used and/or the size of the rounded profile desired to be formed; however, addition of $O_2$ gas exceeding 30% results in formation of a silicon oxide film on the surface of a film to be etched due to chemical reaction of oxygen and silicon in the oxide film and the etching stops proceeding. Additionally, since etching proceeds without adding $O_2$ gas when $SF_6$ gas, $NF_3$ gas, or the like is used, it is desired to adjust an added amount of $O_2$ gas within a range of 0% to 30%.

Wet etching is yet another isotropic etching technique. When the wet etching is applied to the above-stated round forming process, however, other process steps would increase in number, which lead to increase of the costs. Hence, it is better to apply isotropic etching based on dry etching to the above-described round forming process like in the present embodiment in order to facilitate prevention of cost increase of semiconductor devices.

Next, as shown in part (e) of FIG. 2, a main etching process is performed for completely removing the dummy gate 202 which remains even after completion of the above-stated round forming process using a mixture gas of $Cl_2$ gas, $O_2$ gas, HBr gas, and Ar gas and plasma with the process pressure of 0.4 Pa and the microwave power of 800 W while applying the RF power of 80 W.

This main etching process affects the height of a final metal gate in a similar way to the above-stated round adjustment process. Therefore, it is required to enhance the etching selectivity between the dummy gate 202 and the interlayer oxide film 203 so that the interlayer oxide film 203 is etched as little as possible during removal of the dummy gate 202.

After this main etching process, it is thus possible to form a trench or a via having rounded profiles at the upper part of the insulating film 204 without protruded profiles 206 as shown in part (e) of FIG. 2. In other words, it is possible to form a trench or a via having top rounds.

Next, as shown in part (f) of FIG. 2, a filling process is carried out, which is for filling a gate insulating film (illustration is omitted) made of high-k material and a metal film 207 in the trench or the via that is formed by removal of the dummy gate 202.

After this filling process, the gate insulating film (illustration is omitted) made of high-k material and the metal film 207 deposited on the interlayer oxide film 203 are polished by chemical mechanical polishing (CMP), thereby forming a metal gate using the gate insulating film of high-k material as shown in part (g) of FIG. 2.

As described above, with the present embodiment, it is possible to form top rounds at trenches or vias even when there are no masks for forming the trenches or the vias.

Next, a method for forming a metal gate using a gate insulating film of high-k material by a gate-last technique in which top rounds at trenches or vias are not formed is explained with reference to the drawings below.

Figure 3:
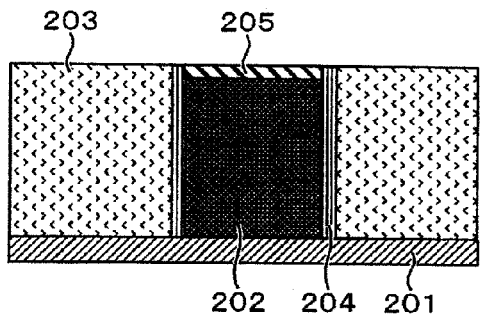
FIG. 3 is a diagram to explain a flow of a metal gate forming method which does not incorporate the principles of the present invention.
Figure 3:
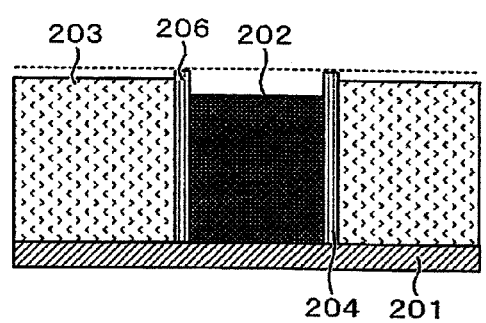
Figure 3:
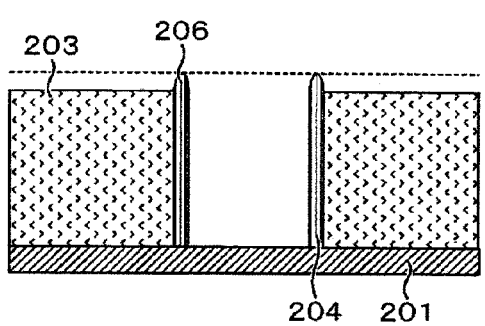
Figure 3:
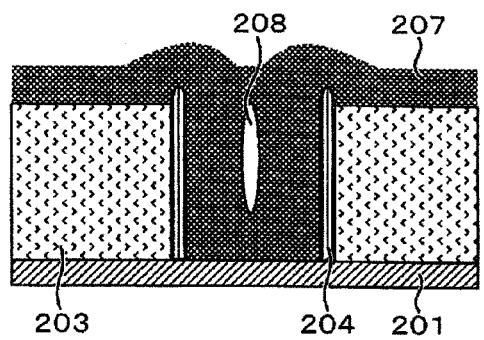

As shown in FIG. 3, a break-through process of part (b) of FIG. 3, a main etching process of part (c) of FIG. 3, and a filling process of part (d) of FIG. 3 are sequentially performed. Here, the break-through process of part (b) of FIG. 3, the main etching process of part (c) of FIG. 3, and the filling process of part (d) of FIG. 3 are the same processing steps as the break-through process of part (b) of FIG. 2, the main etching process of part (e) of FIG. 2, and the filling process of part (f) of FIG. 2, respectively; hence, explanations thereof are omitted.

In the case of a metal gate being formed by the gate-last technique shown in FIG. 3, the protruded profiles 206 formed in the break-through process remain even after removal of the dummy gate 202 and filling of the metal film 207 in the filling process becomes difficult, resulting in generation of a void 208, which is an empty space. Due to the generation of this void 208, it is no longer possible to form the metal gate that satisfies design specifications of semiconductor devices to be fabricated.

The generation of this void 208 is because in the method of forming the metal gate based on the gate-last technique of FIG. 3 it is impossible to make the upper part of the insulating film 204 in a rounded profile without a protrusion.

In contrast, the method of forming the metal gate based on the gate-last technique shown in FIG. 2, which incorporates principles of the present invention, is capable of making the upper part of the insulating film 204 in a rounded profile without a protrusion so that it is possible to fill the metal film 207 without creating the void 208. Accordingly, it becomes possible to improve the coverage when a metal film is filled after removal of the dummy gate and it can contribute to improvements in performance and manufacturing yield of semiconductor devices.

Up to here, in the present embodiment the method of forming the metal gate with the gate-last technique has been described; this is not to be construed as limiting the invention. The present invention may also be applicable to other cases of forming openings in which a metallic film is filled, such as a process of forming a plug for connecting electrodes or a process of forming through-holes (or contacts, vias, holes, etc.) for connecting wiring lines.

For instance, the present invention may also be applicable to deep trench processes, dual damascene processes, shallow trench isolation (STI) processes, or the like.

Although in the present embodiment the electron cyclotron resonance (ECR) plasma etching apparatus is employed, which uses microwave, the present invention is applicable regardless of types of plasma production method. For example, the present invention is also applicable to heliconwave plasma etching apparatus, inductively-coupled plasma etching apparatus, capacitively-coupled plasma etching apparatus, or the like.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A dry etching method used when forming a metal gate with a gate-last technique, said method comprising:
   a round adjustment step of partially removing a dummy gate by etching said dummy gate with its periphery surrounded by an interlayer oxide film to a prespecified depth, and exposing a sidewall of an insulating film disposed between said dummy gate and said interlayer oxide film;

a round forming step of forming a round by isotropic etching a top end part of said insulating film after said round adjustment step; and a main etching step of removing a remaining part of said dummy gate after said round forming step.

2. A metal gate manufacturing method in a gate-last technique, in which a metal gate is formed by filling a metal film into a trench formed by removing a dummy gate and removing excess of said metal film, said method comprising:

a round adjustment step of removing a part of said dummy gate by plasma etching so that an insulating film arranged on a sidewall of said dummy gate is exposed;

a round forming step of forming a round by isotropic plasma etching at a top end part of said exposed insulating film after said round adjustment step;

a main etching step of removing by plasma etching a remaining part of said dummy gate after said round forming step;

a filling step of filling said metal film into a trench formed in said main etching step; and a polishing step of removing metal film deposited excessively in said filling step over said trench formed in said main etching step.

3. A plasma processing method of forming a metal gate in a gate-last technique by filling a metal film into a trench formed by removing a dummy gate and removing excess of said metal film, said method comprising:

a round adjustment step of removing a part of said dummy gate by plasma etching so that an insulating film arranged on a sidewall of said dummy gate is exposed;

a round forming step of forming a round by isotropic plasma etching at a top end part of said exposed insulating film after said round adjustment step; and a main etching step of removing by plasma etching a remaining part of said dummy gate after said round forming step.

4. The plasma processing method according to claim 3, wherein said isotropic plasma etching in said round forming step is performed with plasma using a mixture gas of fluorine-containing gas and oxygen gas.

5. The plasma processing method according to claim 4, wherein said isotropic plasma etching in said round forming step is performed without supplying radio-frequency electrical power to a wafer on which a metal gate is formed in a gate-last technique.

6. The plasma processing method according to claim 4, wherein said mixture gas comprises $O_2$ and $CHF_3$.

7. The plasma processing method according to claim 4, wherein said mixture gas comprises $O_2$ and one selected from the group consisting of $CF_4$, $SF_6$, $NF_3$, $CH_2F_2$, $CH_3F$, and $C_4F$.

8. The plasma processing method according to claim 4, wherein said isotropic plasma etching in said round forming step is performed by supplying 0 $W/cm^2$ to 0.042 $W/cm^2$ radio-frequency electrical power to a wafer on which a metal gate is formed in a gate-last technique.

* * * * *